United States Patent
Oh et al.

(10) Patent No.: US 8,946,091 B2
(45) Date of Patent: Feb. 3, 2015

(54) PREVENTION OF LINE BENDING AND TILTING FOR ETCH WITH TRI-LAYER MASK

(75) Inventors: Youn-Jin Oh, San Ramon, CA (US); Kenji Takeshita, Sunnyvale, CA (US); Hitoshi Takahashi, Yokohama (JP)

(73) Assignee: Lam Research Corporation, Fremont, CA (US)

( * ) Notice: Subject to any disclaimer, the term of this patent is extended or adjusted under 35 U.S.C. 154(b) by 242 days.

(21) Appl. No.: 13/096,697

(22) Filed: Apr. 28, 2011

(65) Prior Publication Data
US 2012/0276747 A1 Nov. 1, 2012

(51) Int. Cl.
*H01L 21/302* (2006.01)
*H01L 21/311* (2006.01)

(52) U.S. Cl.
CPC .... *H01L 21/31144* (2013.01); *H01L 21/31116* (2013.01); *H01L 21/31138* (2013.01)
USPC .............. 438/736; 438/725; 438/737; 216/81

(58) Field of Classification Search
CPC ............ H01L 21/311; H01L 21/31127; H01L 21/31138; H01L 21/31058; H01L 21/31144
USPC ......... 438/706, 710, 712, 714, 723, 725, 735, 438/736, 780; 216/41.47, 81
See application file for complete search history.

(56) References Cited

U.S. PATENT DOCUMENTS

| | | | |
|---|---|---|---|
| 7,081,413 B2* | 7/2006 | Chan et al. | 438/706 |
| 2005/0032320 A1* | 2/2005 | Yokoyama | 438/296 |
| 2007/0181975 A1 | 8/2007 | Koops et al. | |
| 2008/0102619 A1* | 5/2008 | Lee | 438/594 |
| 2008/0261125 A1* | 10/2008 | Hishiro | 430/5 |
| 2009/0047794 A1* | 2/2009 | Ogawa et al. | 438/725 |
| 2009/0093125 A1* | 4/2009 | Wilson et al. | 438/735 |
| 2009/0197422 A1* | 8/2009 | Kang et al. | 438/717 |
| 2009/0239375 A1* | 9/2009 | Riess et al. | 438/640 |

* cited by examiner

*Primary Examiner* — Lan Vinh
(74) *Attorney, Agent, or Firm* — Beyer Law Group LLP

(57) ABSTRACT

A method for etching features in an etch layer is provided. An organic mask layer is etched, using a hard mask as an etch mask. The hard mask is removed, by selectively etching the hard mask with respect to the organic mask and etch layer. Features are etched in the etch layer, using the organic mask as an etch mask.

18 Claims, 9 Drawing Sheets

PREVENTION OF LINE BENDING AND TILTING FOR ETCH WITH TRI-LAYER MASK

BACKGROUND OF THE INVENTION

The present invention relates to etching an etch layer through a mask during the production of a semiconductor device. More specifically, the present invention relates to etching using a tri-layer mask.

SUMMARY OF THE INVENTION

To achieve the foregoing and in accordance with the purpose of the present invention a method for etching features in an etch layer is provided. An organic mask layer is etched, using a hard mask as an etch mask. The hard mask is removed, by selectively etching the hard mask with respect to the organic mask and etch layer. Features are etched in the etch layer, using the organic mask as an etch mask.

In another manifestation of the invention, a method for etching features in an etch layer disposed below an organic mask layer, disposed below a hard mask layer, disposed below a patterned photoresist mask is provided. The hard mask layer is etched using the patterned photoresist mask as an etch mask to form a hard mask. The organic mask layer, is etched using the hard mask as an etch mask, comprising providing a hydrogen free organic etch gas, forming the hydrogen free organic etch gas into a plasma, and etching the organic mask using the plasma. The hard mask is removed by selectively etching the hard mask with respect to the organic mask and etch layer. Features are etched in the etch layer, using the organic mask as an etch mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
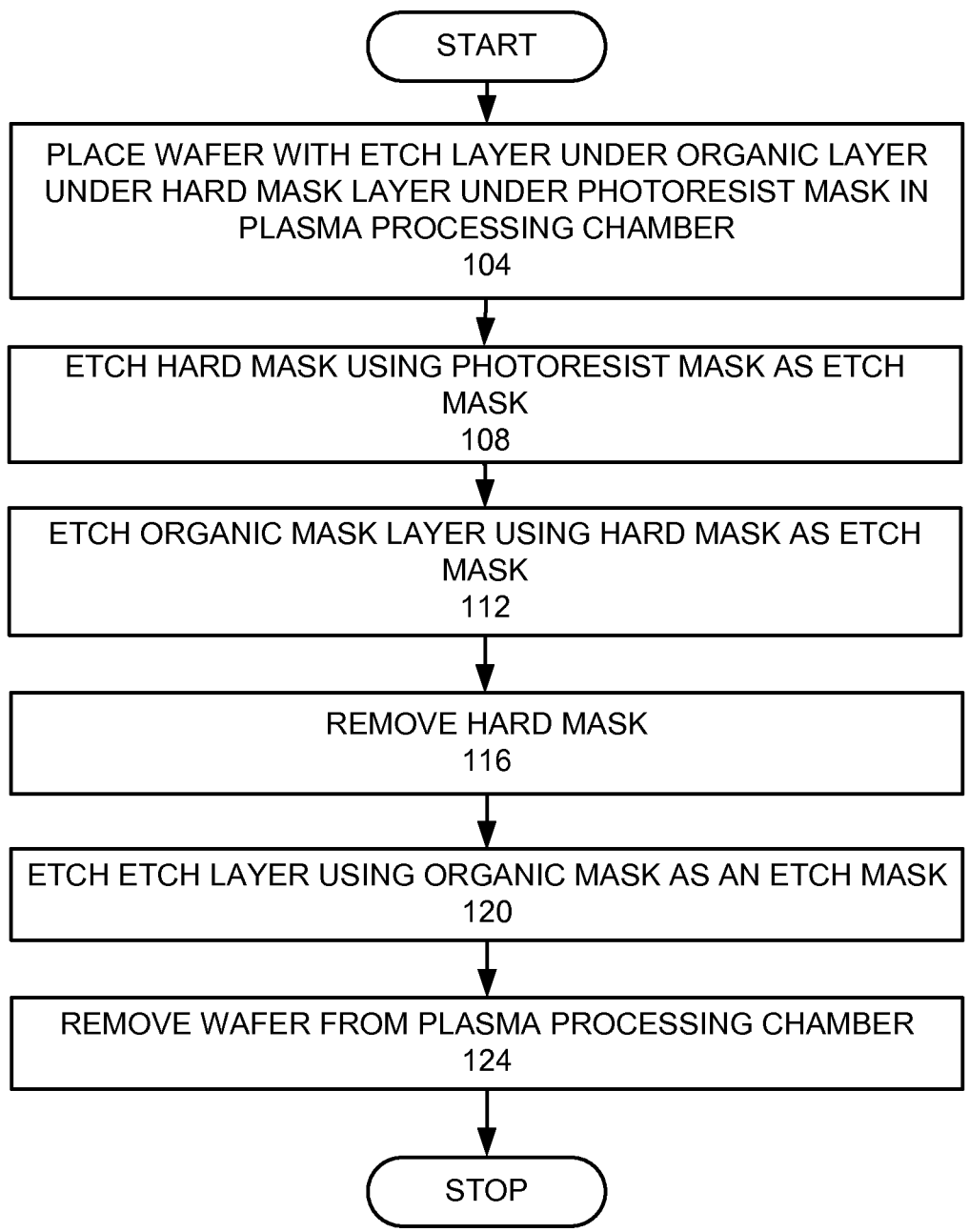
FIG. 1 is a flow chart of an embodiment of the invention.

To facilitate understanding, FIG. 1 is a high level flow chart of a process used in an embodiment of the invention. A method for etching features in an etch layer is provided. A wafer with an etch layer under an organic layer under a hard mask layer under a photoresist mask is placed in a plasma processing chamber (step 104). The hard mask layer is etched using the photoresist mask as an etch mask (step 108). The organic mask layer is etched using the hard mask as an etch mask (step 112). Preferably, the etching of the organic mask layer uses a hydrogen free etch gas. The hard mask is selectively removed (step 116). The etch layer is then etched (step 120). The wafer is removed from the plasma processing chamber (step 124).

Example

Figure 2A:
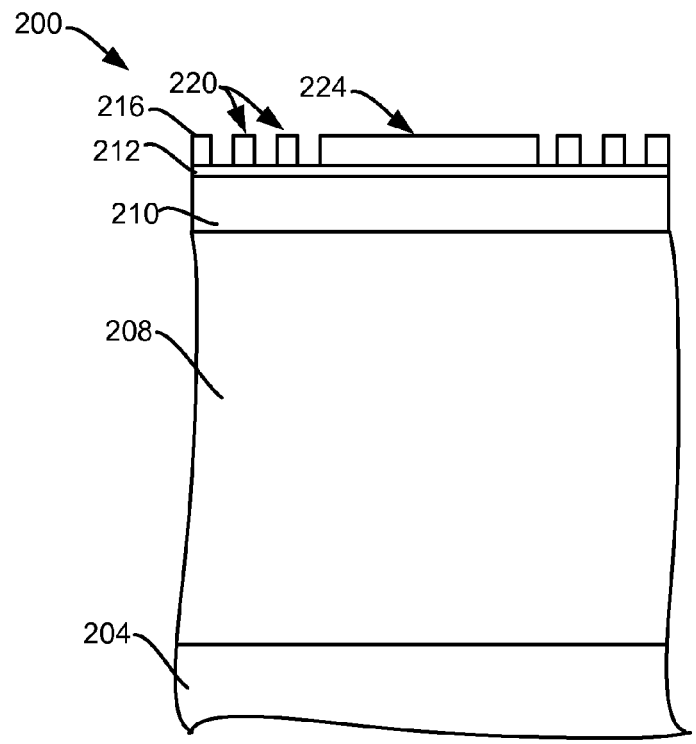
FIGS. 2A-E are schematic views of a stack processed according to an embodiment of the invention

In a specific example of the invention, a wafer with an etch layer under an organic layer under a hard mask layer under a photoresist mask is placed in a plasma processing chamber (step 104). FIG. 2A is a schematic cross-sectional view of a stack 200 with a photoresist mask 216 formed over a hard mask layer 212, formed over an organic mask layer 210, formed over an etch layer 208 formed over a substrate 204. One or more additional layers, such as an antireflective layer may be disposed between the layers shown in this example. In addition, one or more layers may be between the etch layer 208 and the substrate 204. The etch layer 208 may be a dielectric layer such as silicon oxide, silicon nitride, silicon oxynitride, or a low-k dielectric material, or the etch layer 208 may be a conductor such as silicon. In this example, the etch layer is silicon oxide. It should be noted that in this example, the patterned photoresist mask forms a plurality of narrower lines 220 and a wider line 224. In this example, the wider line 224 has a width that is at least four times wider than the width of the narrower lines 220.

Figure 3:
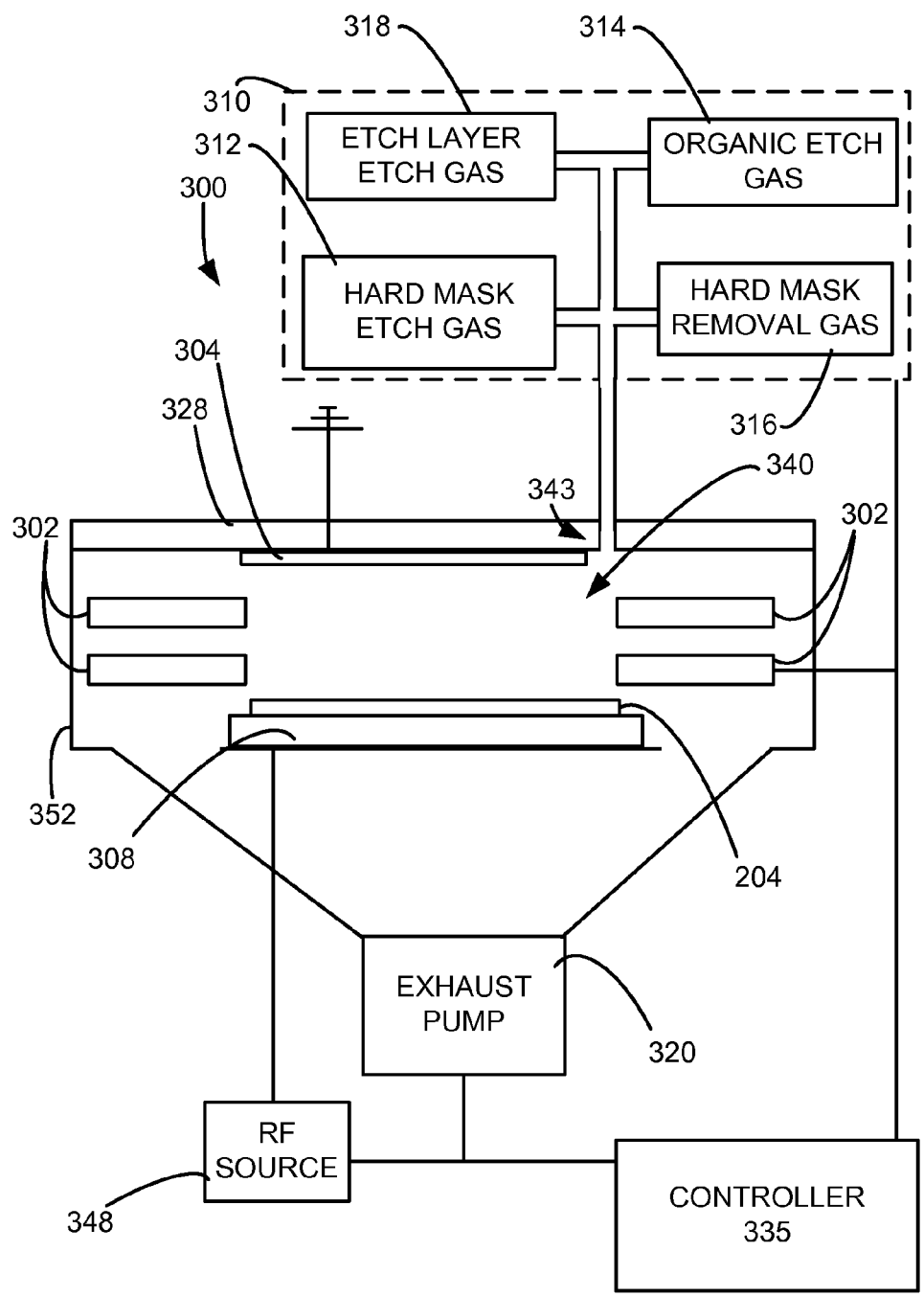
FIG. 3 is a schematic view of a plasma processing chamber that may be used for etching.

FIG. 3 is a schematic view of a plasma processing chamber 300 that may be used for one or more of the following steps. The plasma processing chamber 300 comprises confinement rings 302 (although other embodiments may use other confinement devices), an upper electrode 304, a lower electrode 308, a gas source 310, and an exhaust pump 320. Within the plasma processing chamber 300, the substrate 204 is positioned upon the lower electrode 308. The lower electrode 308 incorporates a suitable substrate chucking mechanism (e.g., electrostatic, mechanical clamping, or the like) for holding the substrate 204. The reactor top 328 incorporates the upper electrode 304 disposed immediately opposite the lower electrode 308. The upper electrode 304, lower electrode 308, and confinement rings 302 define the confined plasma volume 304. Gas is supplied to the confined plasma volume 340 through a gas inlet 343 by the gas source 310 and is exhausted from the confined plasma volume through the confinement rings 302 and an exhaust port by the exhaust pump 320. Besides helping to exhaust the gas, the exhaust pump 320 helps to regulate pressure. In this embodiment, the gas source 310 comprises a hard mask etch gas source 312, an organic layer etch gas source 314, a hard mask removal gas source 316, and an etch layer etch gas source 318. The gas source 310 may further comprise other gas sources. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment, the 27 MHz, 60 MHz and 2 MHz power sources make up the RF power source 348 connected to the lower electrode, and the upper electrode is grounded. A controller 335 is controllably connected to the RF source 348, exhaust pump 320, and the gas source 310. The process chamber can be a: CCP (capacitive coupled plasma) reactor or an ICP (inductive coupled plasma) reactor.

Figure 4:
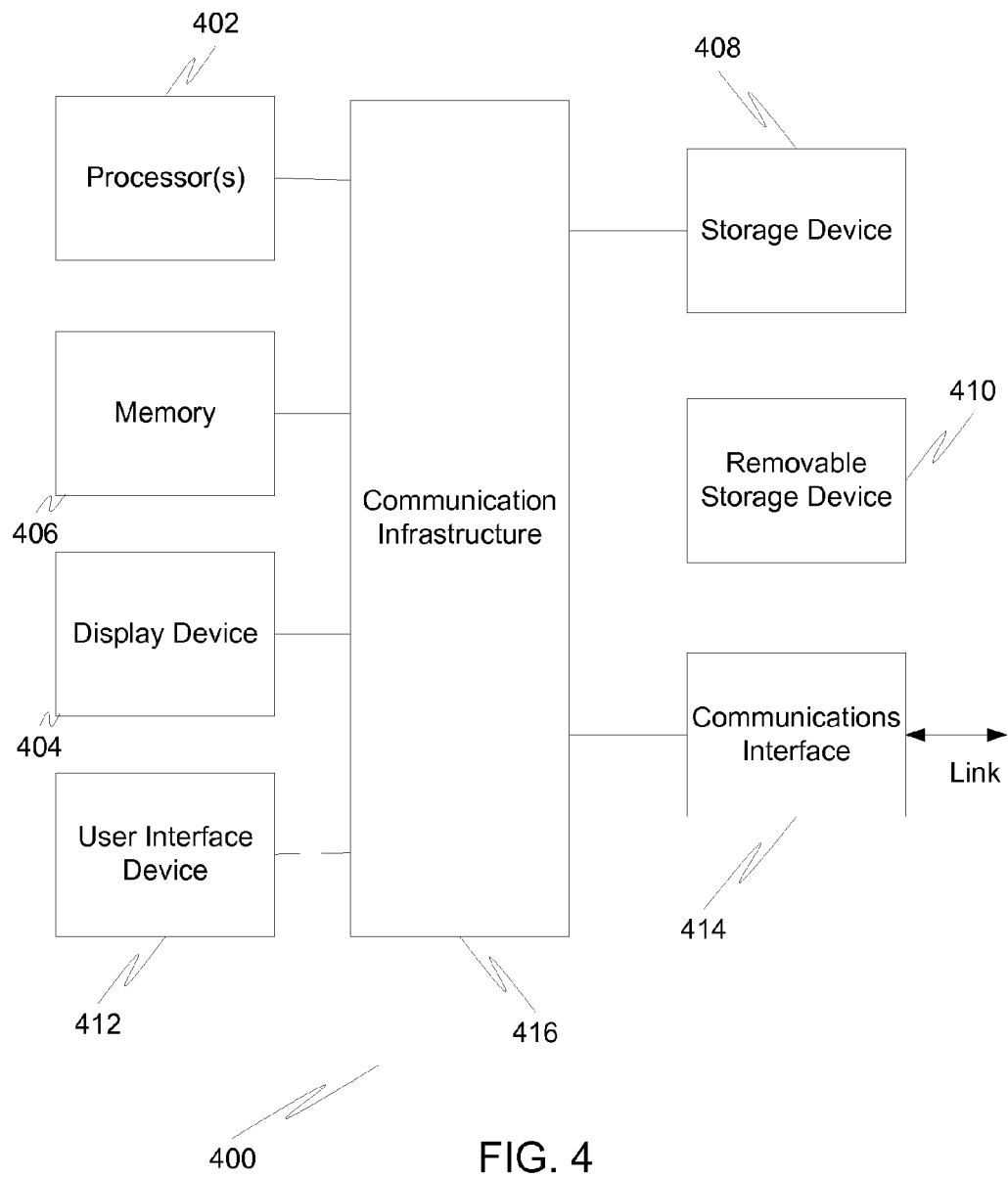
FIG. 4 illustrates a computer system, which is suitable for implementing a controller used in embodiments of the present invention.

FIG. 4 is a high level block diagram showing a computer system 400, which is suitable for implementing a controller 335 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
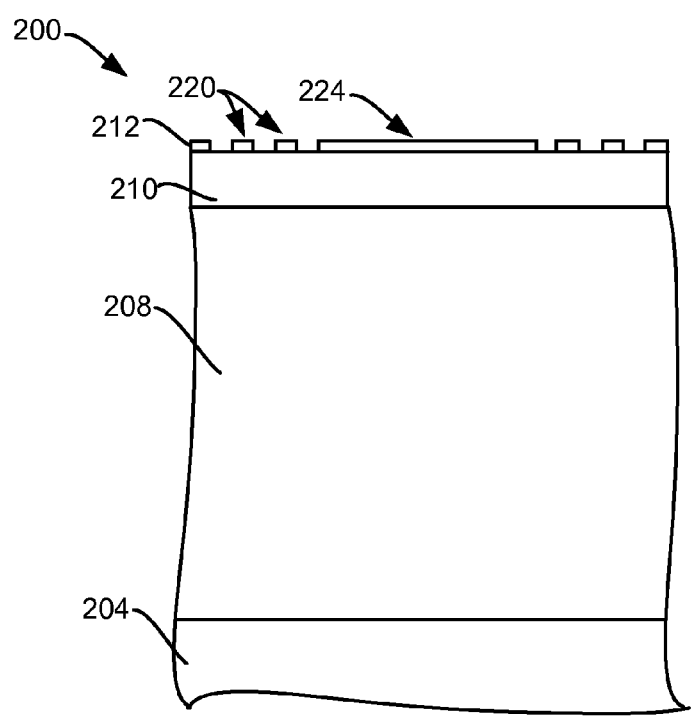

The plasma processing chamber 300 may be used to transfer the pattern from the photoresist mask 216 to the hard mask layer 212 (step 108). FIG. 2B is a schematic cross-sectional view of the stack 200, after the hard mask 210 has been etched. Generally, a hard mask etch gas is flowed from the hard mask etch gas source 312 into the plasma processing chamber. The hard mask etch gas is formed into a plasma, which etches the hard mask layer. The flow of the hard mask etch gas is then stopped.

Figure 2C:
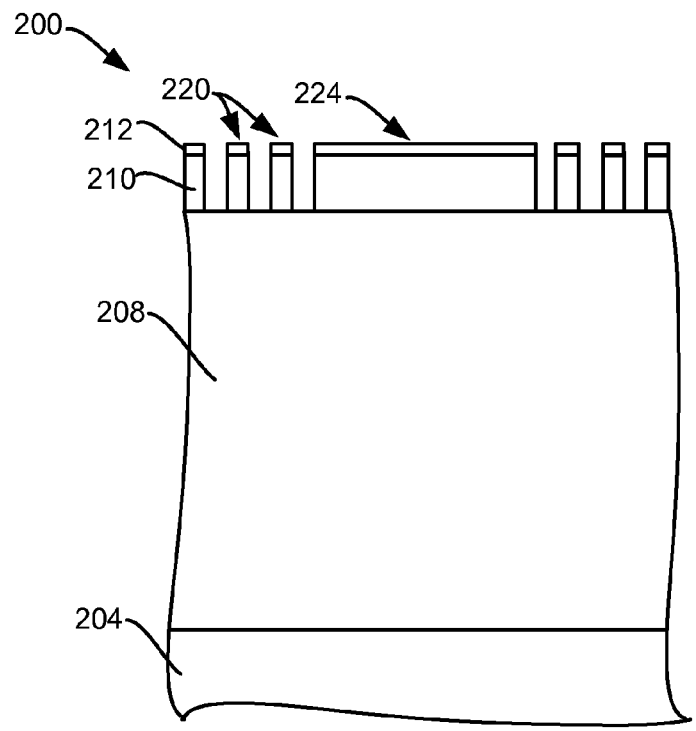

The pattern is then transferred from the hard mask 212 to the organic mask layer 210 to form a patterned organic mask (step 112). In the preferred embodiment of the invention, the etching of the organic mask comprises flowing a hydrogen free organic etch gas from the organic etch gas source 314 into the plasma processing chamber, forming a plasma from the organic etch gas, etching the organic mask layer with the plasma, and then stopping the flow of the organic etch gas. More preferably, the hydrogen free etch gas comprises at least one of carbonyl sulfide (COS), carbon monoxide (CO), carbon dioxide ($CO_2$), or nitrogen ($N_2$). More preferably the organic etch gas comprises COS. A specific recipe for etching the organic mask provides a pressure of 10 milliTorr. A hydrogen free etch gas of 100 sccm $N_2$, 50 sccm $O_2$, and 15 sccm COS is flowed into the plasma processing chamber with a center weighting of 50% where 50% of the hydrogen free etch gas is flowed at the center and 50% is flowed at the edge. 800 Watts at 60 MHz of RF is provided. The process is maintained for 20 seconds before the plasma is extinguished and the flow of the hydrogen free etch gas is stopped. In another example recipe a pressure of 15 milliTorr is provided. A hydrogen free etch gas of 100 sccm $O_2$ and 10 sccm COS is flowed into the plasma processing chamber. 800 Watts at 60 MHz of RF is provided. The process is maintained for 50 seconds before the plasma is extinguished and the flow of the hydrogen free etch gas is stopped. FIG. 2C is a schematic cross-sectional view of the stack 200, after the organic mask layer 210 has been etched.

Figure 2D:
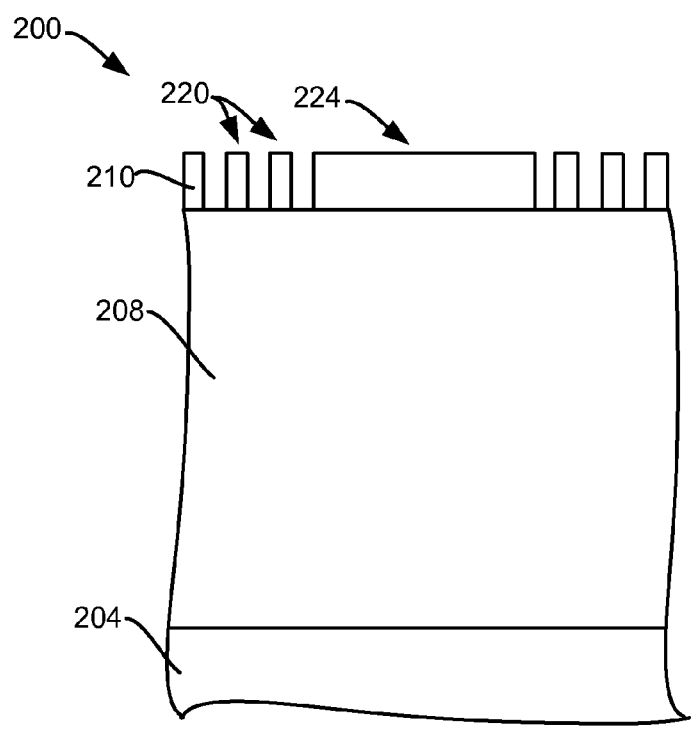

The hard mask 212 is selectively removed (step 116). Preferably a low bias is used to remove the hard mask 212 so that a minimal amount of the etch layer is etched. Preferably, the bias voltage is less than 500 volts. More preferably the bias is less than 200 volts. Preferably, the hard mask is selectively etched with respect to the etch layer, with a selectivity of at least 2:1. More preferably the selectivity is at least 4:1. Generally, a hard mask removal gas is flowed from the hard mask removal gas source 316 into the plasma processing chamber. A plasma is formed from the hard mask removal gas, which removes the hard mask. Then the flow of the hard mask removal gas is stopped. An example of a recipe for removing the hard mask provides a pressure of 70 milliTorr. A hard mask removal gas of 80 sccm $CF_4$ and 100 sccm $CHF_3$ is flowed into the plasma processing chamber with a center weighting of 50%. 800 Watts at 60 MHz of RF is provided. The process is maintained for 10 seconds before the plasma is extinguished and the flow of the hard mask removal gas is stopped. FIG. 2D is a schematic cross-sectional view of the stack 200 after the hard mask is removed. The selective removal of the hard mask completely removes the hard mask. By only providing RF power at 60 MHz, the bias power is kept sufficiently low to allow hard mask removal without significantly etching the etch layer.

Figure 2E:
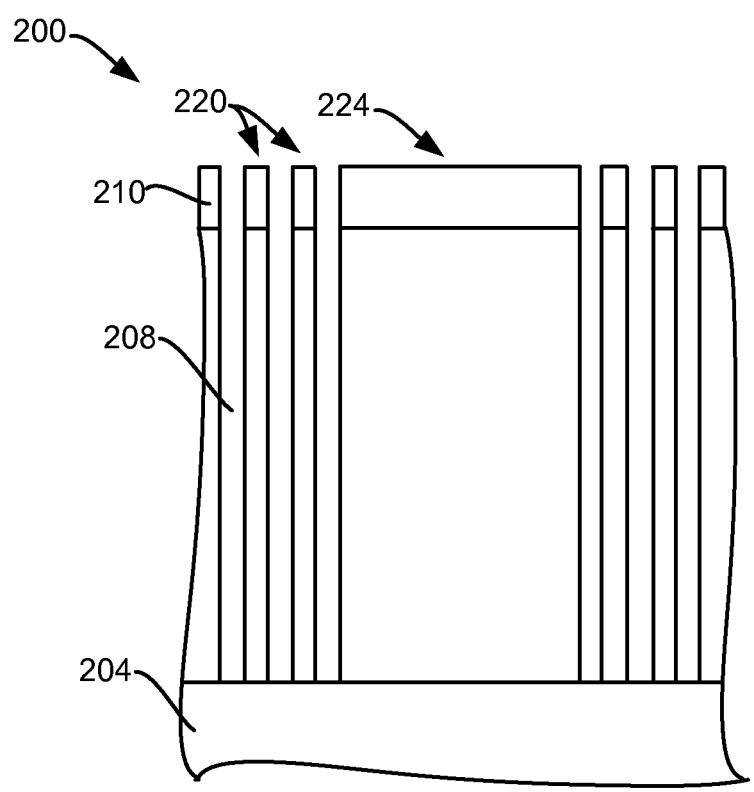

The etch layer is etched using the organic mask as the etch mask (step 120). Generally, an etch layer etch gas is flowed from the etch layer etch gas source 318 into the plasma processing chamber. A plasma is formed from the etch layer etch gas to etch the etch layer. The flow of the etch layer etch gas is stopped. In this embodiment, where the etch layer is a silicon oxide based etch layer, an etch that selectively etches silicon oxide with respect to organic material is used. An example of such a recipe provides a pressure of 30 milliTorr to the plasma processing chamber. An etch layer etch gas of 300 sccm Ar, 12 sccm $C_4F_8$, and 16 sccm $O_2$ is flowed into the plasma processing chamber with a center weighting of 35% of the etch layer etch gas flowed at the center and 65% flowed at the edge. 900 Watts of RF is provided at 60 MHz, and 900 Watts of RF is provided at 27 MHz, and 600 Watts of RF is provided at 2 MHz FIG. 2E is a schematic cross-sectional view of the stack 200, after the etch layer 208 has been etched. The narrower and wider lines 220, 224 preferably have a CD of less than 50 nm for the narrower lines 220 and greater than 300 nm for the wider lines. More preferably the lines have a CD of no more than 30 nm. In addition, the narrow lines have an aspect ratio, which is the ratio of the line height to line width. Preferably, the aspect ratio of the narrow lines is at least 2 to 1. More preferably, the aspect ratio of the narrow lines is at least 4 to 1.

The wafer is removed from the plasma processing chamber (step 124). In this embodiment of the invention, a plasma processing chamber may be used for the steps of etching the hard mask, etching the organic mask layer, removing the hard mask and etching the etch layer. In other embodiments, different plasma processing chambers may be used for different etch steps.

One benefit provided by the invention is that the invention reduces tilting. In addition, the invention reduces tilting in narrower lines adjacent to wider lines. As feature size decreases and aspect ratio increases, line bending/tilting becomes a serious issue in line and space etching applications, especially for the first narrower line right next to a wider line with tri-layer (photoresist/hard mask layer/organic mask layer). Without being bound by theory, it is believed that the line bending/tilting next to the wider line is a geometric loading effect from the wider line to the first narrower line.

Figure 5:
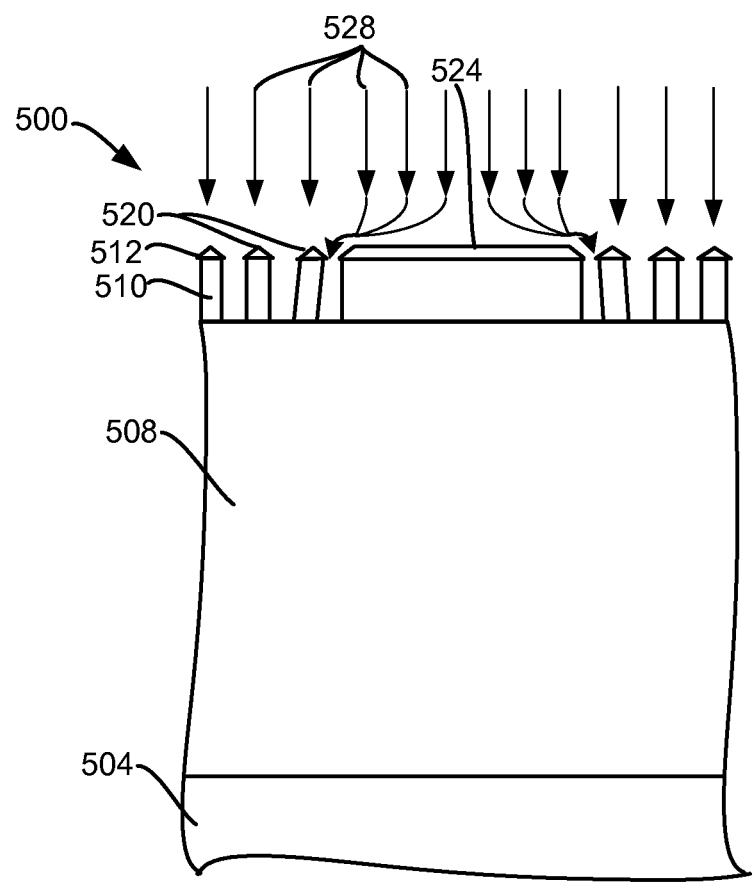
FIG. 5 is a stack that is processed with a hydrogen containing etch gas.

FIG. 5 is a schematic illustration of a stack 500 with a substrate 504, and etch layer 508, an organic mask layer 510, and a hard mask 512, with narrower lines 520 and wider lines 524. The organic layer 510 is being etched with the hard mask layer 512 providing an etch mask, where the organic etch plasma ion/radical flow 528 is shown, where the organic etch plasma is formed from a hydrogen-based organic etch layer etch chemistry. The ion/radical flow 528 shows that a uniform ion/radical flow 528 may be provided, which provides a uniform ion/radical flow 528 over the narrower lines 520. Over the wider line 524 the ion/radical flow 528 flows sideways so that a greater amount of ion/radical flow flows into the space between the wider lines 524 and the narrower lines 520 closest to the wider lines 524. This greater amount of ion/radical flow in the space between the wider lines and the narrower lines 520 closest to the wider lines 524 causes the narrower lines 520 closest to the wider lines 524 to be more quickly etched on the side of the narrower lines 520 closest to the wider lines 524, which causes the narrower lines 520 closest to the wider lines 524 to bend or tilt towards the wider line 524, which demonstrates the geometric loading effect, as shown. The hydrogen-based organic layer etch chemistry causes bend/tilt because of the low hard mask selectivity, which causes huge ion attack to side wall of $1^{st}$ cell line. The invention provides methods of minimizing the geometric loading effect. It was unexpectedly found that by providing a hydrogen free organic etch gas, the geometric loading effect is successfully reduced. It is believed that the removal of hydrogen reduces the sidewall attack of the plasma from the organic etch gas.

One embodiment of the invention may use a hydrogen containing gas to form passivation sidewalls before the subsequent etching of the organic layer using a hydrogen free organic etch gas. Another embodiment of the invention using an etch gas comprising COS was unexpectedly found to prevent sidewall attach of the organic layer, to prevent bending or tilting and without requiring the formation of passivation sidewalls.

Figure 6A:
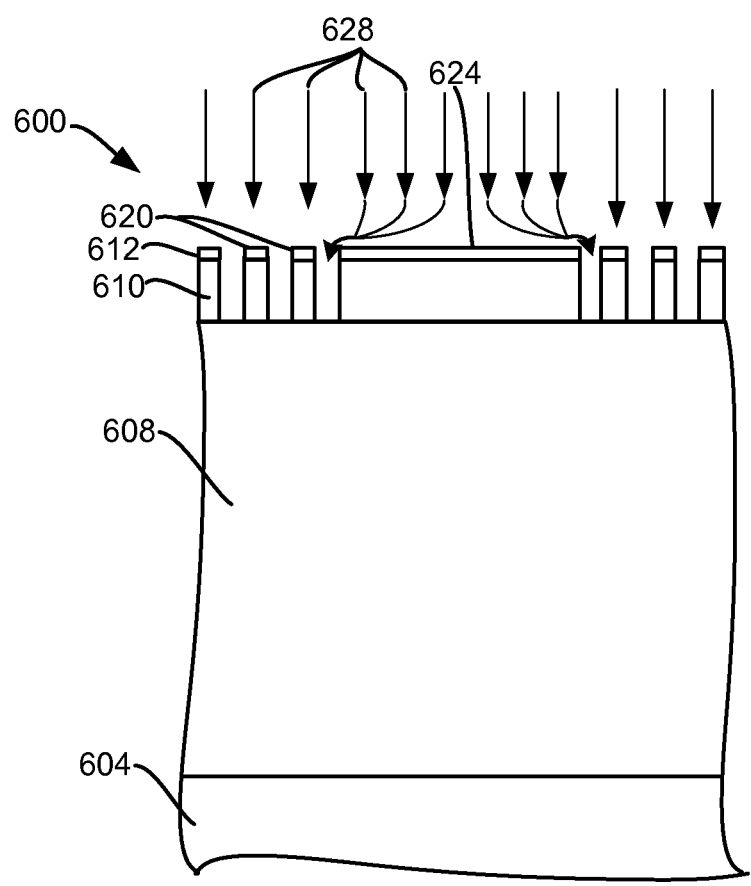
FIGS. 6A-B are stacks processed without first removing a hard mask.
Figure 6B:
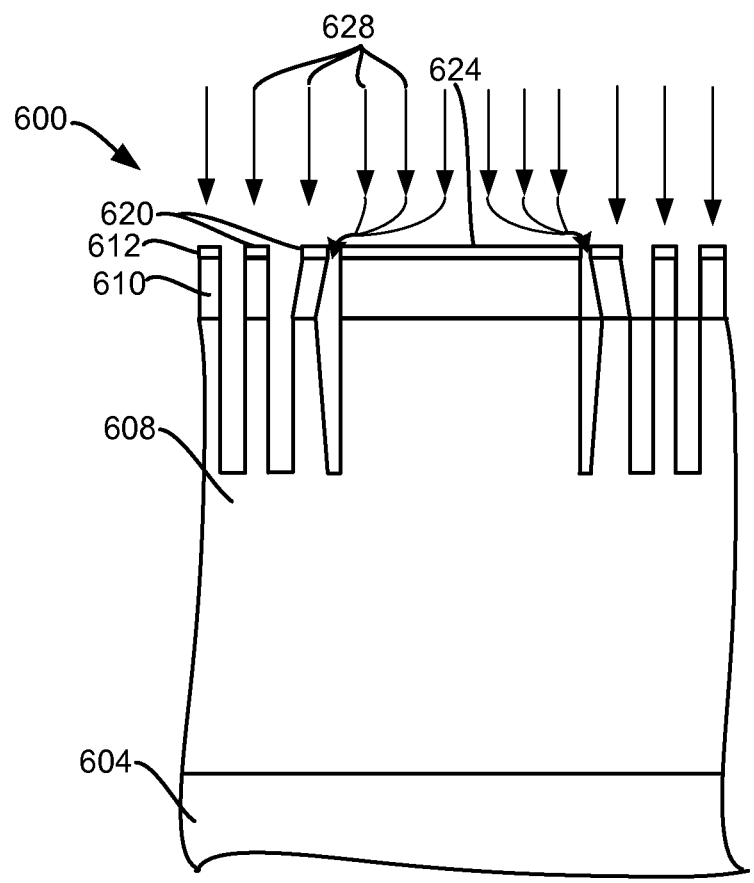

FIG. 6A is a schematic illustration of a stack 600 with a substrate 604, and etch layer 608, an organic mask layer 610, and a hard mask 612, with narrower lines 620 and wider lines 624. The organic layer 610 has been etched with the hard mask layer 612 providing an etch mask, where the bending or tilting was prevented. An ion and polymer flow 628 is used to etch the etch layer 608, using the hard mask 612 and organic mask 610 as an etch mask. A uniform ion and polymer flow 628 may be provided, which provides a uniform ion and polymer flow 628 over the narrower lines 620. Over the wider line 624, the ion and polymer flow 628 flows sideways so that a greater amount of ion and polymer flow flows into the space between the wider lines 624 and the narrower lines 620 closest to the wider lines 624. This greater amount of ion and polymer flow 628 in the space between the wider lines and the narrower lines 620 closest to the wider lines 624 causes the narrower lines 620 closest to the wider lines 624 to be more quickly etched on the side of the narrower lines 620 closest to the wider lines 624 and more polymer to be deposited, which causes the narrower lines 620 closest to the wider lines 624 to bend or tilt towards the wider line 624, which demonstrates the geometric loading effect, as shown in FIG. 6B. As shown, the resulting features adjacent to the wider lines 624 tapers due to the bending. The invention provides methods of minimizing the geometric loading effect. It was unexpectedly found that by removing the hard mask before etching the etch layer, the geometric loading effect is reduced. It is believed that the removal of the hard mask reduces ion scattering from the wider lines which reduces or eliminates bending or tilting.

Generally, the hard mask layer is made of a material that is more resistant to etching than the organic mask layer. Such a hard mask layer may be amorphous carbon. More preferably, the hard mask layer is made of an inorganic material. More preferably, the hard mask layer is made of a silicon containing material. More preferably, the hard mask layer is made of a silicon oxide or silicon nitride based material. Most preferably, the hard mask is spin on glass.

While this invention has been described in terms of several preferred embodiments, there are alterations, permutations modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in an etch layer, comprising:
   etching an organic mask layer, using a hard mask as an etch mask;
   completely removing the hard mask, by selectively etching the hard mask with respect to the organic mask and etch layer;
   etching features in the etch layer, using the organic mask as an etch mask,
   wherein the hard mask defines wider lines and narrower lines adjacent to the wider lines, and wherein the removing the hard mask reduces tilting during the etching the etch layer.

2. The method, as recited in claim 1, wherein the removing the hard mask uses a bias of less than 200 volts.

3. The method, as recited in claim 1, wherein the etching the organic mask, using the hard mask as an etch mask, comprises:
   providing a hydrogen free organic etch gas;
   forming the hydrogen free organic etch gas into a plasma; and
   etching the organic mask using the plasma.

4. The method, as recited in claim 3, wherein the hard mask is disposed below a patterned photoresist mask, further comprising etching the hard mask through the patterned photoresist mask.

5. The method, as recited in claim 4, wherein the hard mask comprises silicon oxide.

6. The method, as recited in claim 4, wherein the hard mask is formed from spin on glass.

7. The method, as recited in claim 4, wherein the etch layer is a silicon oxide based layer.

8. The method, as recited in claim 4, wherein the removing the hard mask uses a bias of less than 500 volts.

9. The method, as recited in claim 4, wherein the narrower lines have a CD of less than 50 nm.

10. The method, as recited in claim 9, wherein the narrower lines formed from the etch layer have an aspect ratio of greater than 2:1.

11. The method, as recited in claim 4, wherein the organic etch gas comprises COS or $CO_2$.

12. The method, as recited in claim 11, wherein the organic etch gas further comprises CO or $N_2$.

13. The method, as recited in claim 12, further comprising:
providing a sidewall forming gas comprising a hydrogen containing component;
forming a plasma from the sidewall forming gas; and
stopping the flow of the sidewall forming gas prior to etching the organic mask.

14. The method, as recited in claim 4, further comprising;
providing a patterned photoresist mask disposed over the hard mask disposed over the organic mask layer, disposed over the etch layer on a wafer into a plasma processing chamber; and
removing the wafer from the plasma processing chamber after etching features in the etch layer.

15. The method, as recited in claim 14, wherein the hydrogen free organic etch gas comprises COS or $CO_2$.

16. A method for etching features in an etch layer disposed below an organic mask layer, disposed below a hard mask layer, disposed below a patterned photoresist mask, comprising:
etching the hard mask layer using the patterned photoresist mask as an etch mask to form a hard mask;
etching the organic mask layer, using the hard mask as an etch mask, comprising; providing a hydrogen free organic etch gas; forming the hydrogen free organic etch gas into a plasma; and etching the organic mask using the plasma;
completely removing the hard mask, by selectively etching the hard mask with respect to the organic mask and etch layer, wherein the hard mask defines wider lines and narrower lines adjacent to the wider lines, and wherein the removing the hard mask reduces tilting during the etching the etch layer; and
etching features in the etch layer, using the organic mask as an etch mask.

17. The method, as recited in claim 14, wherein the removing the hard mask uses a bias of less than 200 volts.

18. The method, as recited in claim 16, wherein the hydrogen free organic etch gas further comprises CO or $N_2$.

* * * * *